(12) United States Patent
Tatsumi et al.

(10) Patent No.: US 7,476,916 B2
(45) Date of Patent: Jan. 13, 2009

(54) SEMICONDUCTOR DEVICE HAVING A MIS-TYPE FET, AND METHODS FOR MANUFACTURING THE SAME AND FORMING A METAL OXIDE FILM

(75) Inventors: Toru Tatsumi, Tokyo (JP); Nobuyuki Ikarashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/558,271

(22) PCT Filed: May 31, 2004

(86) PCT No.: PCT/JP2004/007480

§ 371 (c)(1),
(2), (4) Date: Oct. 16, 2006

(87) PCT Pub. No.: WO2004/107451

PCT Pub. Date: Dec. 9, 2004

(65) Prior Publication Data

US 2007/0096104 A1    May 3, 2007

(30) Foreign Application Priority Data

May 29, 2003    (JP)    ............................. 2003-153232

(51) Int. Cl.
   *H01L 29/772* (2006.01)
(52) U.S. Cl. .................. 257/213; 257/66; 257/E29.242
(58) Field of Classification Search .................. 257/66, 257/213, 410; 438/24, 591
   See application file for complete search history.

(56) References Cited

U.S. PATENT DOCUMENTS 6,642,131 B2    11/2003   Harada
6,780,708 B1*   8/2004   Kinoshita et al. ........... 438/241
2003/0045080 A1*  3/2003   Visokay et al. .............. 438/591
2003/0218223 A1* 11/2003   Nishiyama et al. .......... 257/410

FOREIGN PATENT DOCUMENTS

| JP | 2000-349287 A | 12/2000 |
| JP | 2003-008011 A | 1/2003 |
| JP | 2003-124460 A | 4/2003 |
| JP | 2003-179051 A | 6/2003 |
| JP | 2003-347297 A | 12/2003 |

OTHER PUBLICATIONS

Wilk et al., "Electrical properties of hafnium silicate gate dielectrics deposited directly on silicon" Applied Physics Letters 74, 2854 (1999).*

S. Zurcher et al., "New Single-Source Precursors for the MOCVD of High-κ Dielectric Zirconium Silicates to Replace $SiO_2$ in Semiconducting Devices," Chemical Vapor Deposition, 2002, vol. 8:4; pp. 171-177.

* cited by examiner

*Primary Examiner*—Jami M Valentine
(74) *Attorney, Agent, or Firm*—Foley & Lardner LLP

(57) ABSTRACT

[Problems] To provide a semiconductor device including a MIS-type FET having an excellent characteristic of low leakage current despite use of a high-K material of a high dielectric constant in a gate insulating film. [Means for solving Problems] A MIS-type field-effect-transistor (FET) including: a silicon substrate (1); an insulating film (6) formed on the silicon substrate and containing silicon and at least one of nitrogen and oxygen; a metal oxide film formed on the insulating film and containing silicon and hafnium; and a gate electrode formed on the metal oxide film, wherein a silicon molar ratio (Si/(Si+Hf)) in the meal oxide film is in the range of 2 to 15%.

8 Claims, 13 Drawing Sheets

Fig. 6
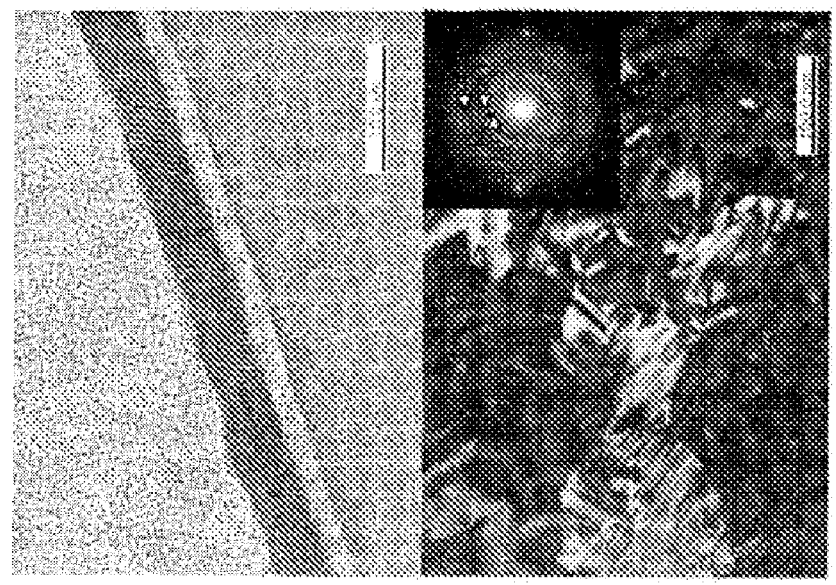
(b) HfO2
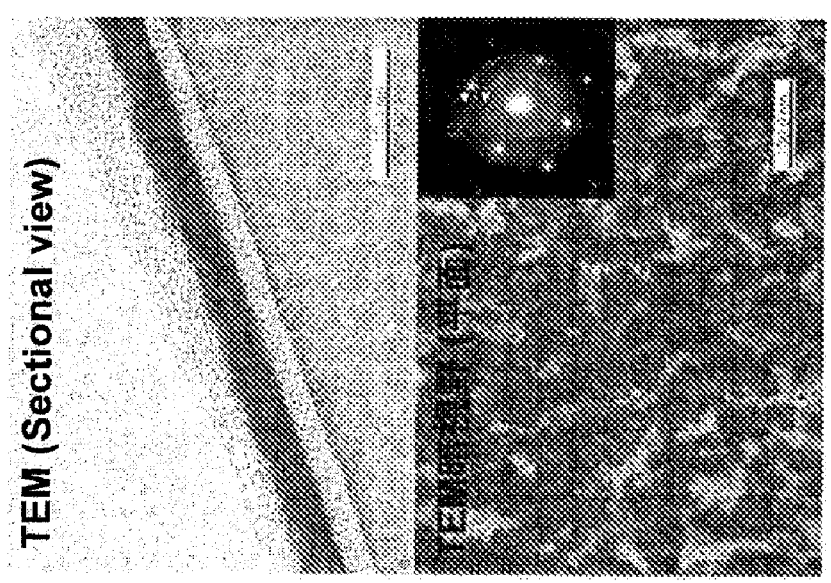
(a) HfSiO
TEM (Sectional view)
TEM Dark Field (Top plan view)

SEMICONDUCTOR DEVICE HAVING A MIS-TYPE FET, AND METHODS FOR MANUFACTURING THE SAME AND FORMING A METAL OXIDE FILM

TECHNICAL FIELD

The present invention relates to a semiconductor device having a MIS-type field-effect-transistor (FET) and a method for manufacturing the same and, more particularly, to a semiconductor device having a MIS-type FET including, as a gate insulating film, a laminated insulator film including a metal oxide film including silicon and hafnium and an interface insulating film including silicon, and a method for manufacturing the same.

BACKGROUNG ART

Gate insulating films in sub-0.1 µ-generation CMOS (Complementary Metal-Oxide-Semiconductor) devices are desired having a thickness as small as 1.6 nm in terms of equivalent $SiO_2$ thickness. $SiO_2$ having a thickness of 1.6 nm is difficult to use in practical application, due to the poor insulating capability thereof, even in a logic device in which a high-speed operation is sought at a risk of an increase in the power dissipation caused by a leakage current. In addition, lower power dissipation is the most required performance in LSI devices used as personal portable electronic devices which are presumed to have a larger demand. Thus, it is considered essential to adopt a new material having a dramatically lower leakage current than the conventional $SiO_2$ in a gate insulating film having a leakage current density that affects a larger part in the power dissipation of the whole device.

In order for achieving a lower capacitance in an insulating film having a equivalent oxide thickness of 1.6 nm and yet obtaining a lower leakage property, it is effective to use a new material (high-K material) having a higher dielectric constant than $SiO_2$ and to increase the physical thickness thereof. For example, use of a material having a dielectric constant ten times as high as that of $SiO_2$ allows the physical thickness achieving a performance of the 1.6-nm equivalent $SiO_2$ thickness to be set at 16 nm, which can prevent a dielectric breakdown of the film caused by a direct tunnel current. It should be noted here that the high-K materials are metal oxides in general, and polarization based on the physical and chemical structure thereof is the origin of the high dielectric constant.

However, those metal oxides have disadvantages compared to $SiO_2$ in consideration that they are employed as gate insulating films in an LSI device. A representative example thereof is the heat resistance of these metal oxides. In a process for forming a gate in an LSI, a lamp anneal process at a high temperature (at around 1050 degrees C.) is essential for activating the source/drain and suppressing depletion of the polysilicon gate. Most metal oxides do not endure such high temperatures: for example, $ZrO_2$ is decomposed at a temperature of 900 degrees C. or above to react with silicon and produce a silicide, thereby degrading the leakage characteristic. Even $HfO_2$, which is considered to have a relatively higher heat resistance, reacts with an overlying polysilicon gate to degrade the leakage characteristic thereof at a temperature of 1000 degrees C. or above.

$SiO_2$ (or SiON), which has been used for forming a gate insulating film in a conventional LSI, does not react with silicon at such a high temperature without oxygen. This property prevents diffusion of impurities into the silicon, to thereby achieve improvement of flatness of the insulating film, reduction of the leakage current and suppression of inter-device property variation in the LSI, and is highly important for the improvement in the product yield and performances of the LSI. The fact that the gate insulating film is decomposed or reacts with an overlying or underlying silicon film means the lost of such advantages, which have been achieved and considered as a matter of course. As a result, it may be predicted that a desired performance itself cannot be obtained in addition to occurring of reduction in the product yield.

Thus, a material for the gate insulating film having a higher dielectric constant than $SiO_2$ and stable at temperatures used in the LSI fabrication process.

As one of the materials satisfying the above requirements, a mixed-oxides material including silicon oxide and an oxide of a metal other than silicon is investigated. For example, Ti—Si—O, Zr—Si—O, Hf—Si—O and La—Si—O are enumerated as typical examples of such materials. These materials are stable at higher temperatures of 1000 degrees C. or above.

However, there is a problem in that those materials have an extremely reduced dielectric constant due to inclusion of silicon. For example, Hf—Si—O having a metal composition ratio of 1:1 has a dielectric constant of 10-15. Considering that SiON etc. used in a gate insulating film in the current device has an effective dielectric constant of around 6, the increase in the physical film thickness obtained by the dielectric constant of these silicon-containing metal oxides is 1.5 times that of SiON at most. The relative reduction in the leakage current by using those materials, if obtained, will be effective only in the next one-generation devices whereby those materials are predicted to have a short life-time.

JP-A-2003-8011, for example, describes a gate insulating film including a high-dielectric-constant film containing a metal, oxygen and silicon. It is described in the same publication that the high-dielectric-constant film, if the composition thereof is expressed as $M_xSi_yO$ (where x>0 and y>0), has a preferable composition of $0.23 \leq y/(x+y) \leq 0.90$ from the view point of dielectric constant and thermal stability, or $0.23 \leq y/(x+y) \leq 0.30$ from the view point of reliability life-time and thermal stability.

DISCLOSURE OF THE INVENTION

Problems to be solved by the Invention

As described above, an alloy oxide including silicon and a metal other than silicon is the mainstream high-K material for use in a gate insulating film instead of the conventional $SiO_2$ (or SiON). However, the dielectric constant thereof is around 10 at most, and cannot be used in a gate insulating film in a plurality of next generations.

Thus, it is an object of the present invention to provide a semiconductor device including a MIS-type FET which, despite using the high-K material having a high dielectric constant in a gate insulating film, has a superior low-leakage characteristic, and a method for manufacturing the same.

Means for Solving the Problem

The present invention provides a semiconductor device comprising a MIS-type field-effect-transistor (FET) including: a silicon substrate; an insulating film formed on the silicon substrate and containing silicon and at least one of oxygen and nitrogen; a metal oxide film formed on the insulating film and containing silicon and hafnium; and a gate electrode formed on the metal oxide film, wherein a silicon molar ratio (Si/(Si+Hf)) in the meal oxide film is not lower than 2% and not higher than 15%.

It is to be noted that the molar ratio in the present invention is expressed in terms of percentage.

The present invention also provides a method for forming a metal oxide film containing silicon and hafnium by vapor phase deposition using metal-organic hafnium and metal-organic silicon as metal sources and water as an oxidizing agent, wherein a partial pressure of said water is not lower than 1E-6 Torr (1.33×10⁻⁴ Pa) and not higher than 1E-5 Torr (1.33×10⁻³ Pa).

Effect of the Invention

In accordance with the semiconductor device of the present invention, a semiconductor device having a MIS-type FET having a superior characteristic of low leakage current, despite use of a high-K material having a high dielectric constant in the gate insulating film.

In accordance with the manufacturing method of the present invention, a gate insulating film made of a high-K material having a higher heat resistance and higher dielectric constant can be obtained, and thus the characteristic degradation during the heat treatment in the manufacturing process for the semiconductor device can be suppressed. As a result, a MIS-type FET having a lower leakage current and a higher capacitance across the insulating film can be formed, thereby achieving a higher-speed and lower-power-dissipation silicon LSI can be obtained.

The present inventors found that use of a metal oxide containing hafnium and silicon in a specific composition range in a gate oxide film maintains the dielectric constant thereof at a higher value and achieves a remarkable improvement in the leakage characteristic after a high-temperature heat treatment. The present invention was devised based on this finding.

PREFERRED EMBODIMENTS OF THE INVENTION

The principle of the present invention will be described before describing the embodiments of the present invention. FIG. 1 shows the relationship between the equivalent oxide thickness (EOT) of a MISFET that was manufactured by the method of an embodiment of the present invention and the gate leakage current (Ig) thereof.

Upon the manufacture, isolation regions were formed on the (100) silicon surface, $SiO_2$ was formed to a thickness of 1.2 nm in the silicon channel regions by using an RTO technique, and a $HfO_2$ film or a HfSiO film having a 1.3% silicon molar ratio (Si/(Si+Hf)) was formed using a MOCVD technique. Thereafter, anneal was conducted at a temperature of 600 degrees C. for ten minutes under the condition of partial oxygen pressure at 5×10⁻³, followed by a anneal in a nitrogen atmosphere at a temperature of 800 degrees C. for 30 seconds. Gate polysilicon was formed thereon to a thickness of 150 nm. Thereafter, the MISFET was formed using a normal process, and subjected comparison in the gate leakage current and electrical gate film thickness thereof. For activation of source/drain, a lamp anneal was conducted at 1000 degrees C. for 10 seconds.

As shown in FIG. 1, use of $HfO_2$ containing no silicon in the gate provided a larger electrical gate film thickness compared to the thickness expected from the dielectric constant thereof, and incurred a larger gate leakage. On the other hand, use of HfSiO provided a smaller electrical gate film thickness, and a dielectric constant of 24, which was calculated therefrom and equal to the inherent dielectric constant of $HfO_2$. In addition, the gate leakage was remarkably reduced compared to the case of using $HfO_2$.

As described heretofore, the principal feature of the present embodiment is that a metal oxide containing hafnium and silicon in a specific composition range is used as a material configuring the gate insulating film of a MISFET. In the heat resistance property, i.e., the gate leakage characteristic after the activating anneal for source/drain, an advantageous difference was observed at a silicon molar ratio (Si/(si+Hf)) of 2% or above in the metal oxide film, and above this silicon molar ratio, there was little influence by the silicon concentration. On the other hand, the dielectric constant scarcely changed until the silicon molar ratio in the metal oxide film reached 15%, and reduced significantly after exceeding the 15%. FIG. 2 shows this relationship. In FIG. 2, the heat resistance property is expressed by the gate leakage current (at a voltage of threshold minus 1V) of the MISFET after being subjected to an activating anneal at 1000 degrees for 10 seconds.

The gate insulating film of a MISFET is susceptible to the influence of the manufacturing process such as reaction with the overlying polysilicon substrate and etching damage. Thus, experiments as described below were conducted using an overlying metallic electrode, for the purpose of investigating the inherent characteristic of the films. $HfO_2$ and HfSiO each were formed on a 1.2-nm-thick underlying oxide film to a specific thickness, subjected to annealing at 600 degrees C. for 10 minutes under the condition of partial oxygen pressure at 5×10⁻³, and then subjected to annealing in a nitrogen atmosphere at 800 degrees C. for 30 seconds. XPS measurement thereof exhibited a silicon molar ratio (Si/(Si+Hf)) of 13% in the HfSiO.

After the above samples were subjected to a hydrogen-alloying treatment at 500 degrees C. for 20 minutes, a metallic electrode having an area of 3×10⁻⁴ cm² was formed thereon by evaporation, followed by measurement of voltage-capacitance (CV) characteristic and voltage-current (IV) characteristic. The results of the measurement are shown in FIGS. 3 and 4. Use of the metallic electrode formed by evaporation eliminates the influence by the process for forming the gate in the MISFET. In the results of CV measurement, there is no significant interface state observed in both the $HfO_2$ and HfSiO to exhibit a superior characteristic. The electrical gate film thickness is identical for the case of identical physical thickness between $HfO_2$ and HfSiO, which fact suggests that the dielectric constant of the HfSiO is comparable to that of the $HfO_2$.

FIG. 5 shows the relationship between the equivalent oxide thickness and the gate leakage current. The equivalent oxide thickness was determined from the measurements of the CV characteristic. The gate leakage current was plotted as a leakage current at the voltage of threshold voltage Vfb minus 1 volt, the Vfb being determined from the CV measurement. The $HfO_2$ and HfSiO exhibited the substantially same leakage current. It will be understood from FIG. 5 that the HSiO film obtained by addition of a minute amount of Si has an equivalent oxide thickness and a gate leakage current characteristic comparable to those of the $HfO_2$, which is added with no silicon. Compared to the characteristics in the case of using the overlying metallic electrode, as shown in FIG. 1, both the equivalent oxide thickness and gate leakage current characteristic of the $HfO_2$, which is added with no Si, increase after forming the MISFET. On the other hand, those characteristics of the HfSiO obtained by addition of a minute amount of Si remain substantially same as those characteristics in the case of using the overlying metallic electrode. This means that although $HfO_2$ is degraded by the high temperature in the MISFET process, it is scarcely degraded if a minute amount of silicon is added thereto.

The principle of the present invention is considered to include the following two points. The first point is the change of the crystal structure. FIGS. 6(a) and (b) are TEM photographs (sectional view and top plan view), obtained after 3.5-nm-thick HfSiO and $HfO_2$ were deposited on a 1.2-nm-thick $SiO_2$, and subjected to a source/drain activating anneal at 1000 degrees C. for 10 seconds. If silicon is not added, the grain size of $HfO_2$ is 100 to 300 nm, as shown in FIG. 6(b). On the other hand, if a minute amount of silicon is added therein, the grain size reduces down to below 100 nm, as shown in FIG. 6(a). Along with the reduction, the surface roughness is improved by the inclusion of a minute amount of silicon to thereby improve the flatness thereof as compared to the case of inclusion of no Si. The gate leakage is inferred to occur due to the concave portion of the high-K insulating film configuring a weak spot, and thus the inclusion of a minute amount of silicon is presumed to reduce the surface roughness and improve the leakage characteristic after the crystallization. From this view point, it is preferable to control the diameter of the polycrystalline grains in the metal oxide film down to below 100 nm. In addition, from the view point of controllability and film characteristic of the polycrystalline grains, the diameter of the polycrystalline grains should preferably be 30 nm or above.

The second point of the principle is that silicon scarcely enters crystallized HfO2, if the silicon concentration is lower. FIG. 7 shows the relationship between the silicon concentration measured by TEM EELS in the crystals and the silicon concentration of the film as a whole. This figure reveals that the silicon scarcely exists in the crystals until the silicon concentration (Si/(Si+Hf)) of the film as a whole reaches 15% and is expelled to the grain boundaries (crystal grain boundaries), and that a large amount of silicon is introduced into the crystals after the silicon concentration exceeds the 15%. After the silicon is introduced into the crystals, the crystallinity of HfO2 is damaged, whereby the dielectric constant, which have been maintained by the HfO2 crystals having a higher crystallinity, is reduced to approach the dielectric constant of amorphous $HfO_2$.

In FIG. 2, the dielectric constant gradually reduces along with the volume ratio of the $SiO_2$ thus introduced to the HfO2 crystals until the silicon concentration of the film as a whole reaches 15%. It is probable that, after the silicon concentration exceeds the 15%, Si enters the $HfO_2$ crystals to degrade the crystallinity of the $HfO_2$, resulting in a significant reduction in the dielectric constant of the $HfO_2$ and an abrupt reduction in the dielectric constant of the film as a whole. It is also probable that the $SiO_2$ expelled to the grain boundaries fill the so-called weak spots existing in the grain boundaries, thereby suppressing the reaction between the $HfO_2$ film and the polycrystalline silicon film at the high temperature.

As described above, the minute amount of silicon included prevents the growth of grains in the crystallization of $HfO_2$ to reduce the grain size, thereby reducing the leakage current. Along with this, the silicon itself, which is expelled to the grain boundaries and does not enter the crystals, does not degrade the crystallinity of the $HfO_2$ crystals and thus does not reduce the dielectric constant. The function for reducing the grain size is made explicit at a silicon concentration of 2% or above. On the other hand, the amount of silicon introduced into the crystal grains of the $HfO_2$ significantly increases at a silicon concentration of 15% or above. Thus, the advantage of the present invention can be achieved to the full extent in the range of silicon molar ratio (Si/(Si+Hf)) of not lower than 2% and not higher than 15%.

Hereinafter, a manufacturing method according to an embodiment of the present invention will be described with reference to drawings while comparing the same against the conventional method for forming a hafnium oxide film.

FIGS. 8(a) to 8(d) schematically show a conventional method for forming a hafnium silicon oxide film, referred to as an atomic-layer-deposition technique. In this technique, a silicon oxide film is formed on a silicon substrate as shown in the figure (FIG. 8(a)), and allowed to absorb hafnium source (FIG. 8(b)). Thereafter, the absorbed hafnium source is oxidized (FIG. 8(c)). After sufficiently purging the water, hafnium source is again introduced and allowed to be absorbed on the oxidized hafnium (FIG. 8(b)). This process is iterated to form a $HfO_2$ film, which is finally sintered by annealing (FIG. 8(d)). For allowing the $HfO_2$ to contain silicon, Si source is introduced for one of a plurality of cycles corresponding to the concentration, thereby forming $HfO_2$ and $SiO_2$ in the form of laminate structure. Such a technique of film-formation is superior in the thickness uniformity and the step coverage of the film; however, such a technique for forming a film in the laminate structure has a lower throughput because supply and discharge of gas must be iterated. In particular, if an amide-family source, which vigorously reacts with water, is used therein, a longer time is needed for purging the water to further reduce the throughput. In addition, if the hafnium silicon oxide to be formed has a lower silicon concentration, the gap between the adjacent $SiO_2$ layers in the film becomes large, to render the content distribution in the film ununiform.

There is a known proposed CVD process solving the above problems, wherein a Hf source and oxygen are concurrently irradiated at a higher substrate temperature. For allowing Si to be contained in the film, a Si source is also concurrently introduced, and the in-film silicon concentration can be controlled by the flow rate ratio of the Hf source to the Si source. Such a process can provide a film wherein Si and Hf are uniformly mixed. However, use of oxygen as an oxidizing agent, which has a lower oxidizing performance, necessitates a higher substrate temperature, and under such a condition, there arise a problem in that the underlying Si substrate is re-oxidized to form a transition layer between the Si substrate and the $HfO_2$ or HfSiO layer, thereby increasing the electrical gate film thickness.

FIGS. 9(a) to 9(d) schematically show the manufacturing process for the silicon-containing hafnium oxide film (HfSiO film) of the present invention. First, a silicon oxide film is formed on a silicon substrate by using RTO etc., as shown in the figure (FIG. 9(a)). Instead of the silicon oxide film, or on the silicon oxide film, a silicon nitride film or silicon oxynitride film may be deposited. Thereafter, a film-forming process is conducted while concurrently irradiating Si source, Hf source and water onto the silicon oxide film (FIG. 9(b)). Subsequently, annealing is conducted in an oxidizing atmosphere (FIG. 9(c)), followed by annealing in an inactive atmosphere (FIG. 9(d)).

In general, organic Hf source and organic Si source have a higher reactivity with respect to water, and especially amide-family source reacts vigorously with water. Accordingly, control of partial water pressure is important in the film-forming process; it is necessary to control the partial water pressure at $10^{-6}$ to $10^{-5}$ Torr ($1.33 \times 10^{-4}$ to $1.33 \times 10^{-3}$ Pa) within the film-forming system.

FIG. 10 shows the relationship between the partial water pressure during forming a $HfO_2$ film by a MOCVD technique using tetrakisdiethylaminohafnium ($Hf[NEt_2]_4$) and the amount of in-film impurities (amount of in-film carbon and in-film OH groups). It is understood from this figure that the amount of in-film carbon and OH groups can be suppressed to a lower value at a partial water pressure of $10^{-6}$ to $10^{-5}$ Torr ($1.33 \times 10^{-4}$ to $1.33 \times 10^{-3}$ Pa). The reaction between tetrakisdiethylaminohafnium ($Hf[NEt_2]_4$) and water is expressed by the following formula:

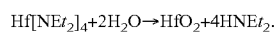

$$Hf[NEt_2]_4 + 2H_2O \rightarrow HfO_2 + 4HNEt_2.$$

The organic groups in the Hf source are removed therefrom after forming diethylamine. However, if the partial water pressure is equal to or below $10^{-6}$ Torr ($1.33 \times 10^{-4}$ Pa), the carbon attributable to unreacted organic groups is received in the film to incur the leakage. In addition, if the partial water pressure exceeds $10^{-5}$ Torr ($1.33 \times 10^{-3}$ Pa), the OH groups attributable to water remain within the film to significantly degrade the reliability thereof.

The substrate temperature during the film-forming process is preferably 450 degrees C. or below. This is because the tetrakisdiethylaminohafnium ($Hf[NEt_2]_4$) is decomposed at 450 degrees C. or above, to make it difficult to effectively remove the OH radicals by using water, whereby a large amount of carbon is introduced in the film. On the other hand, from the film-forming rate view point, the substrate temperature during the film-forming process is preferably 150 degrees C. or above.

In the present film-forming process, the partial water pressure in the film-forming system can be controlled within the above-described range by maintaining the amount of supplied water and discharged air at a constant. During this step, it is also effective to raise the temperature of the inner wall of the system up to 120 degrees C. or above, thereby preventing water from being absorbed by the inner wall. It is also possible to measure the partial water pressure within the system as by using a mass-filter, and control the amount of the supplied water, thereby maintaining the water content in the system at a constant.

Formation of the HfSiO film will be further described with reference to practical film-forming conditions.

First, a 8-inch p-type wafer was used as a substrate, on the surface of which a 1.2-nm-thick thermal oxide film was formed. Subsequently, on the thermal oxide film was formed a film by supplying tetrakisdiethylaminohafnium (Hf[NEt$_2$]$_4$), trisdimethylaminosilicon (HSi[NMt$_2$]$_3$) and H$_2$O at the same time. The film-forming temperature was 400 degrees C. Thereafter, an annealing process is conducted at a temperature of 600 degrees C. for 10 minutes under the condition of partial oxygen pressure at $5 \times 10^{-3}$ Torr (0.665 Pa).

FIG. 11 shows the relationship between the flow rate of Si source and the in-film silicon concentration (molar ratio of (Si/(Si+Hf))) for the case of fixing the flow rate of Hf source at 0.6 sccm. The Si concentration is evaluated by XPS measurements on the surface of the samples. It is understood from FIG. 11 that a larger amount of Si source introduced provides a larger amount of Si received in the film. Although the increase of Si concentration has a tendency of saturation if the flow rate of Si source exceeds 5 sccm, introduction of Si source allows formation of a silicate film having a Si concentration up to at least around 40%.

FIG. 12 shows an XPS spectrum of Si$_2$p in the central area of an 8-inch wafer and the peripheral area between the edge and 30 mm away from the edge (70 mm away from the center) of the wafer. In the two spectra, the peak attributable to the silicate is comparable to the peak attributable to the silicon substrate, thereby assuring that a silicate film having a uniform composition in the wafer surface is formed.

During formation of the metal oxide film, the film forming process may be interrupted to conduct anneal in an oxidizing atmosphere at a temperature of 500 degrees C. or above, and then again conducted until a specified film thickness can be obtained. This allows a further effective reduction in the amount of impurity carbon in the metal oxide film, resulting in a further reduction in the leakage current and the in-film electric charge. It is also highly effective to interrupt the growth at every 1 nm thickness, and the anneal conducted for the first layer achieves a larger effect.

After the above-described film formation process, it is preferable to conduct anneal in an oxidizing atmosphere. This reduces the in-film residual carbon and also recover the oxygen deficit. This anneal is preferably conducted at 500 degrees C. or above, from the view point of achieving a sufficient effect. In addition, this anneal is preferably conducted at a temperature equal to or below 800 degrees C., and more preferably below 700 degrees C., from the view point of efficiency etc. The time length for the anneal may be arbitrarily set between, for example, 1 minute and 3 minutes depending on the treatment temperature.

The oxidizing atmosphere of the anneal conducted during and after the film formation process may use an oxidizing gas or a mixed gas including an inactive gas such as rare gas, i.e., helium, neon, argon etc., or nitrogen gas and an oxidizing gas. Examples of the oxidizing gas include oxygen, ozone, NO, and N$_2$O. The pressure of the oxidizing gas for the oxidizing atmosphere may be arbitrarily set in the range between, for example, $10^{-4}$ Torr ($1.33 \times 10^{-2}$ Pa) and the atmospheric pressure.

Anneal in an inactive atmosphere should be preferably conducted after the film formation process or the anneal in the oxidizing atmosphere. This anneal can be suitably conducted as an RTA process. By using this anneal, the structural defects in the film can be annealed out to provide a higher density for the film, as a result of which the equivalent SiO$_2$ thickness and the leakage current can be reduced. This anneal is preferably conducted at 700 degrees C. or above from the view point of achieving a sufficient effect. In addition, this anneal is preferably conducted at 1000 degrees C. or below, and more preferably at 900 degrees C. or below, from the view point of efficiency etc. The time length for the anneal may be arbitrarily set between, for example, 10 seconds and 5 minutes depending on the treatment temperature. For conducting this anneal in the inactive atmosphere after the anneal in the oxidizing atmosphere, the former anneal should be preferably conducted at a temperature higher than the temperature of the anneal in the oxidizing atmosphere. The inactive atmosphere may use a rare gas, such as helium, neon and argon, a nitrogen gas or a combination of these gases.

Nitrogen may be introduced into the above-described HfSiO film after the formation thereof. The introduction of nitrogen may be performed by an anneal treatment at around 800 degrees C. in an ammonium atmosphere, or by a nitrogen radical treatment at around 400 degrees C. This introduction is capable of assuring the above effects, maintaining the superior characteristics, and suppressing a boron penetration phenomenon from the gate electrode.

A silicon nitride film, such as SiN, may be deposited on the above-described HfSiO film. This suppresses a reaction with the overlying polysilicon, boron penetration and diffusion of impurities, such as boron and phosphor, into the HfSiO film, resulting in a reduction of fixed electric charge in the HfSiO film to achieve a higher mobility.

As described heretofore, the insulating film in the present invention may be provided as a gate insulating film which is superior in the heat resistance property and has a superior low-leakage characteristic, despite of having a high dielectric constant. An insulating film having such characteristics can be formed with ease according to the method of the present invention.

Hereinafter, a MISFET (Metal-Insulator-Semiconductor Field Effect Transistor) according to an embodiment of the present invention, as well as a method for forming the same, will be described with reference to the drawings. FIG. 13 shows the MISFET of the present embodiment in a schematic sectional structure thereof. As shown in the figure, On a silicon substrate 1 having thereon isolation regions 2, is formed a MIS structure having a laminate composed of gate electrode 8/metal oxide film 7/interface insulating film 6, wherein the gate electrode 8 is surrounded by a gate sidewall 9. Within the silicon substrate 1 are disposed a deep diffused region 3 wherein impurities are heavily diffused, a shallow diffused region 4 and a salicide 5, which are formed in self-alignment to the MIS structure.

Next, the method for forming the MISFET of the present embodiment will be described with reference to FIGS. 14(a) to 14(d).

First, a silicon substrate 1 provided with element isolation regions by using an ordinary process is prepared. This substrate is treated using dilute hydrofluoric acid solution to remove a natural oxide film from the surface of the silicon substrate, and then a 1.2-nm-thick thermal oxide film 6 is formed thereon using a RTA (Rapid Thermal Annealing) technique. The thickness of the oxide film is arbitrarily adjusted depending on the electrical film thickness that is finally required; however, a higher film thickness provides an improved characteristic.

Thereafter, a metal oxide film 7 (HfSiO film) having a Si concentration of 10% is deposited using a MOCVD technique to a thickness of 3.5 nm. During the deposition, tetrakisdiethylaminohafnium (Hf[NEt$_2$]$_4$) and trisdimethylaminosilicon (HSi [NMt$_2$]$_3$) were used as the sources of the film, with the substrate temperature being maintained at 400 degrees C., and H$_2$O was concurrently supplied thereto for forming the film (FIG. 14(*a*)). The water is controlled for the flow rate thereof by using a mass-flow controller, with the partial water pressure during the film formation process being set at 8×10$^{-3}$ Torr and the time length for the film formation process being 5 minutes. The Hf source is carried from a 87° C. container by bubbling of nitrogen carrier gas flowing at a rate of 20 sccm. The Si source is supplied while controlling the flow rate thereof suing a mass-flow controller. The temperature of the Si source is set at 48 degrees C.

After the film formation process, anneal in a nitrogen atmosphere is conducted at 600 degrees C. for 10 minutes under the condition of partial oxygen pressure at 5×10$^{-3}$ Torr (0.665 Pa), followed by a anneal.

On the metal oxide film 7 thus formed, a polysilicon film 8 is formed (FIG. 14(*b*)). As a material for the gate electrode, a desired material other than the polysilicon, such as a high-melting-point metal and a nitride thereof, may be used.

Subsequently, the polysilicon film 8 is patterned to a desired pattern to form gate electrodes, followed by forming shallow diffused regions 4 in self-alignment with the pattern of the gate electrodes (FIG. 14(*c*)). During patterning the gate electrodes 8 in the present embodiment, the metal oxide film 7 and interface insulating film 6 are not patterned, and left as it is on the active region of the silicon surface. Thus, the ion implantation for forming the shallow diffused regions 4 is performed through these insulating film. The shallow diffused regions may be formed by ion implantation after removing the metal oxide film 7 and interface insulating film 6 instead.

Thereafter, the gate electrodes thus ion-implanted are subjected to an activating thermal treatment (at 1000 degrees C. or above), followed by formation of gate sidewalls 9 thereon. Then, deep diffused regions 3 are formed and subjected to a thermal activation treatment (at 900 degrees C.) of the diffused regions (FIG. 14(*d*)).

Thereafter, part of the metal oxide film 7 and interface insulating film 6 on top of the deep diffused regions 3 was removed, followed by forming a salicide 5 by using an ordinary process, to thereby obtain the MISFET shown in FIG. 13.

In the MISFET of the embodiment as described above, the present invention is applied to the current, ordinary process. However, the present invention may be applied to a so-called replacement-type process including, after forming each gate electrode while using a silicon oxide film as a gate insulating film, the steps of removing the polysilicon configuring the gate electrode and the silicon oxide configuring the gate insulating film, forming the gate insulating film according to the present invention, and again forming the polysilicon configuring the gate electrode. This process also achieves similar superior results. In addition, similar superior results can be also achieved in a so-called metal gate structure wherein the polysilicon configuring the gate electrode is replaced by a metal.

BRIEF DESCRIPTION OF THE DRAWINGS

FIGS. 6(*a*) and 6(*b*) are TEM photographs of the HfSiO film and HfO$_2$ film, respectively, annealed on the SiO$_2$ film.

Figure 1:
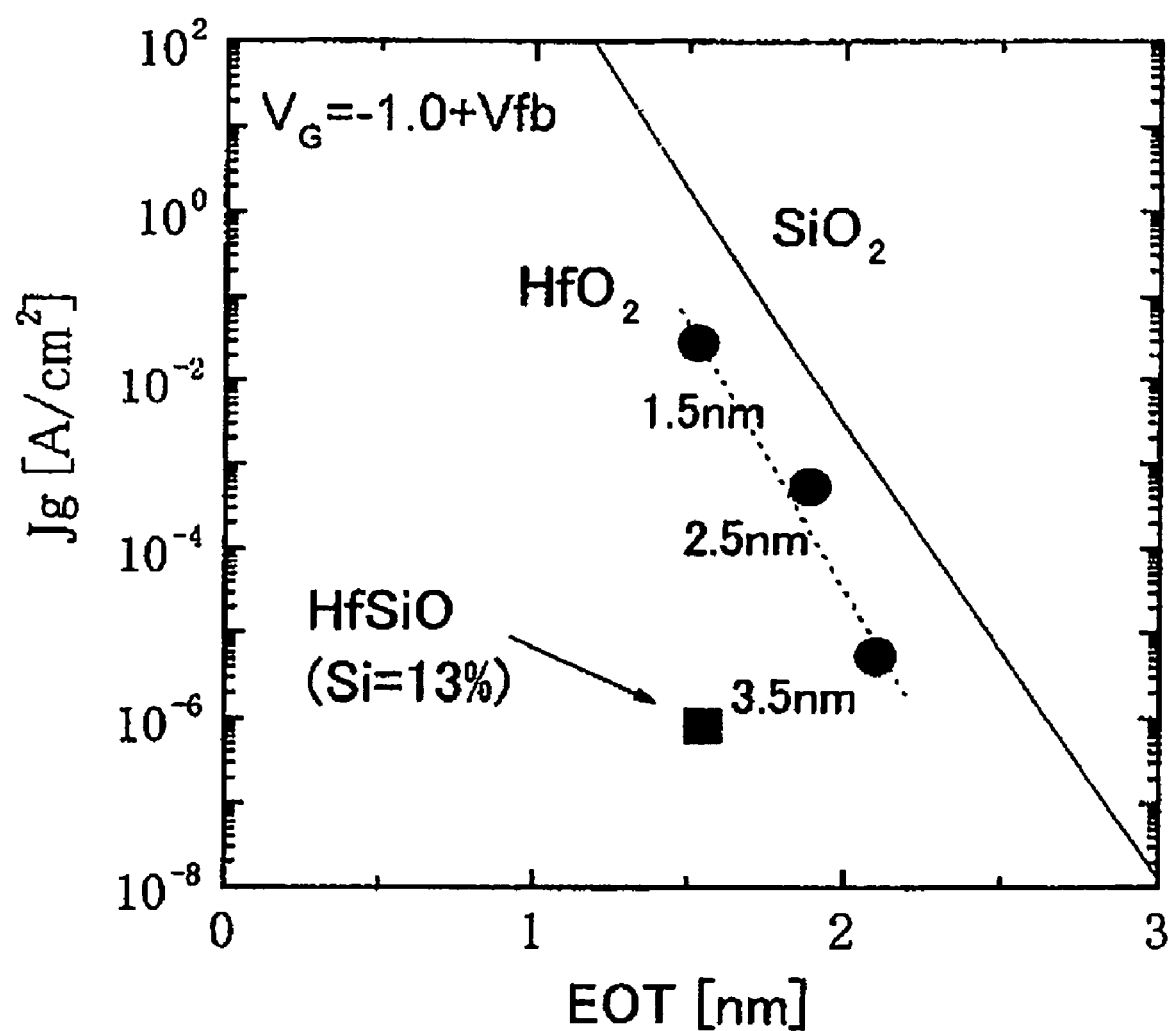
FIG. 1 is a graph showing the relationship between the equivalent oxide thickness (EOT) of a MISFET and the gate leakage current (Ig) thereof.
Figure 2:
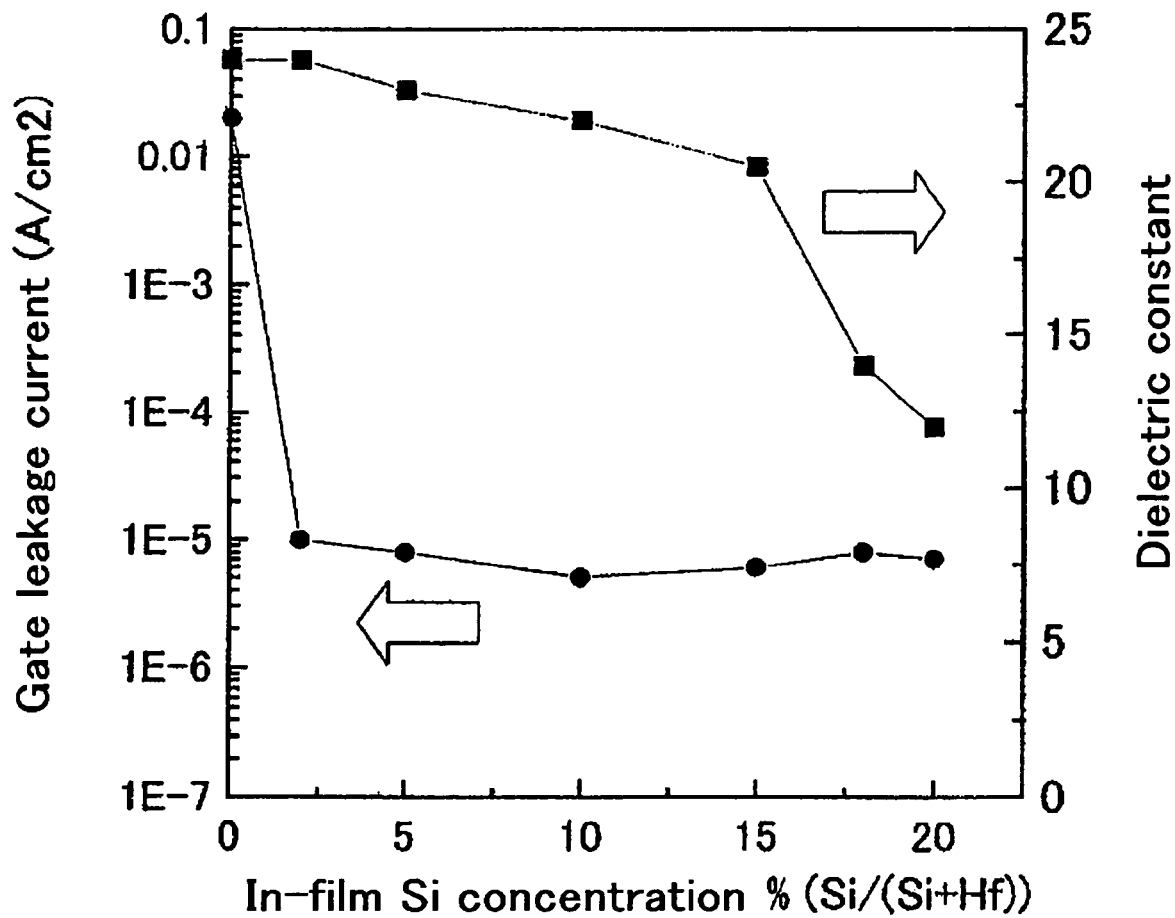
FIG. 2 is a graph showing the relationship between the silicon concentration (molar ratio: Si/(Si+Hf)) in the metal oxide film configuring a gate electrode and the gate leakage current.
Figure 3:
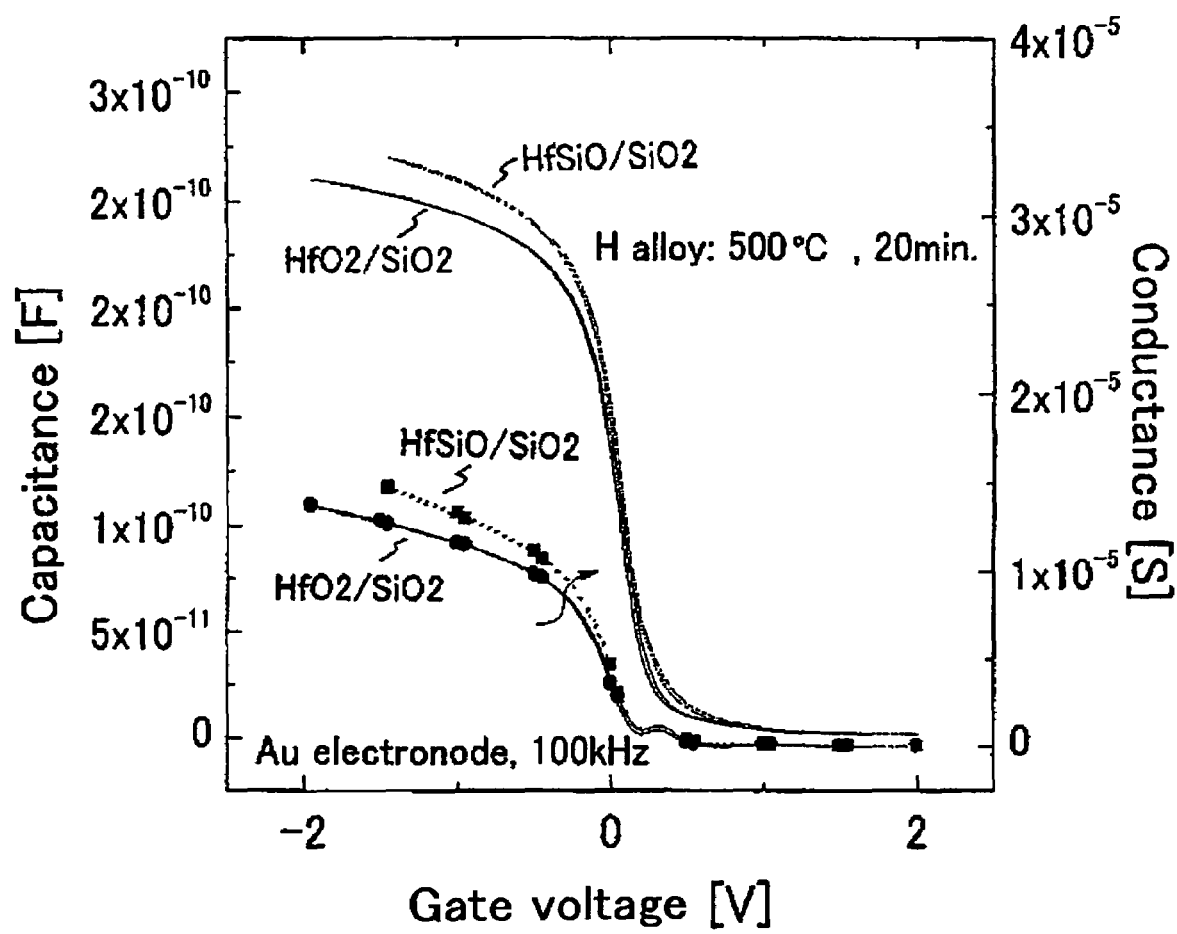
FIG. 3 is a graph showing the CV characteristic of the HfO$_2$ film and HfSiO film measured using a metal electrode.
Figure 4:
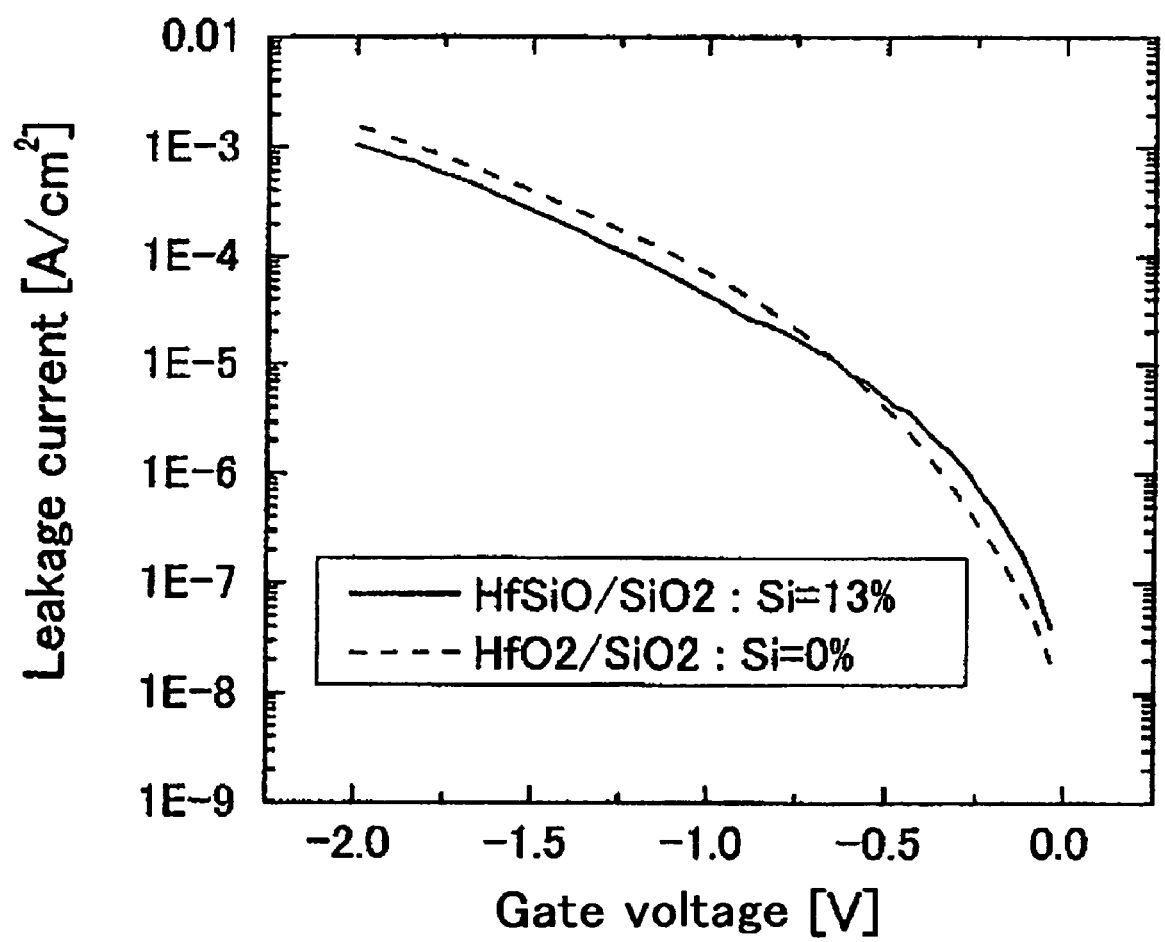
FIG. 4 is a graph showing the relationship between the voltage of the HfO$_2$ film and HfSiO film and the leakage current measured using the metal electrode.
Figure 5:
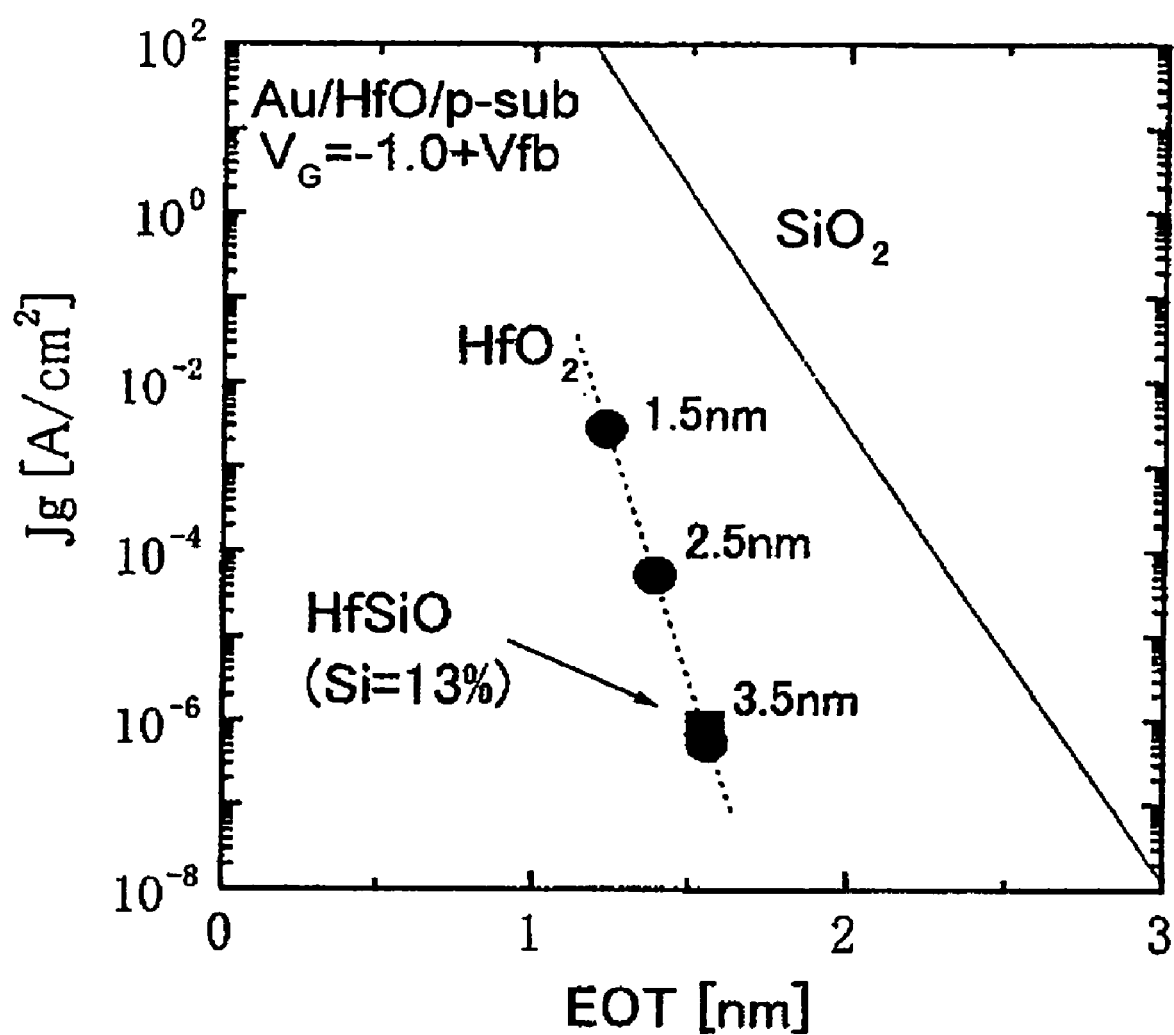
FIG. 5 is a graph showing the relationship between the equivalent oxide thickness (EOT) and the gate leakage current (Ig) of a MISFET.
Figure 7:
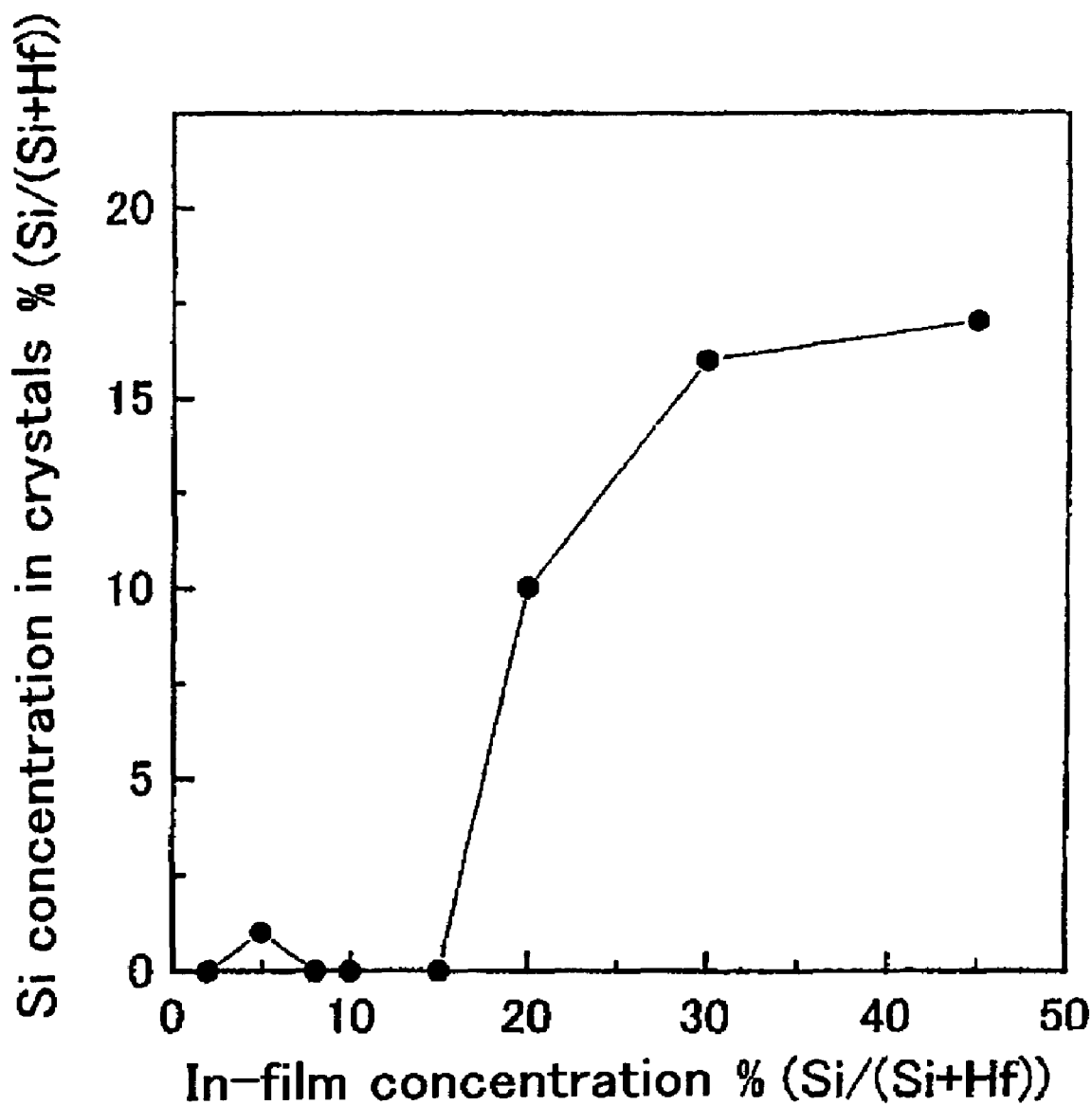
FIG. 7 is a graph showing the relationship between the silicon concentration in the crystals and the silicon concentration of the film as a whole, measured using TEMEELS.
Figure 8:
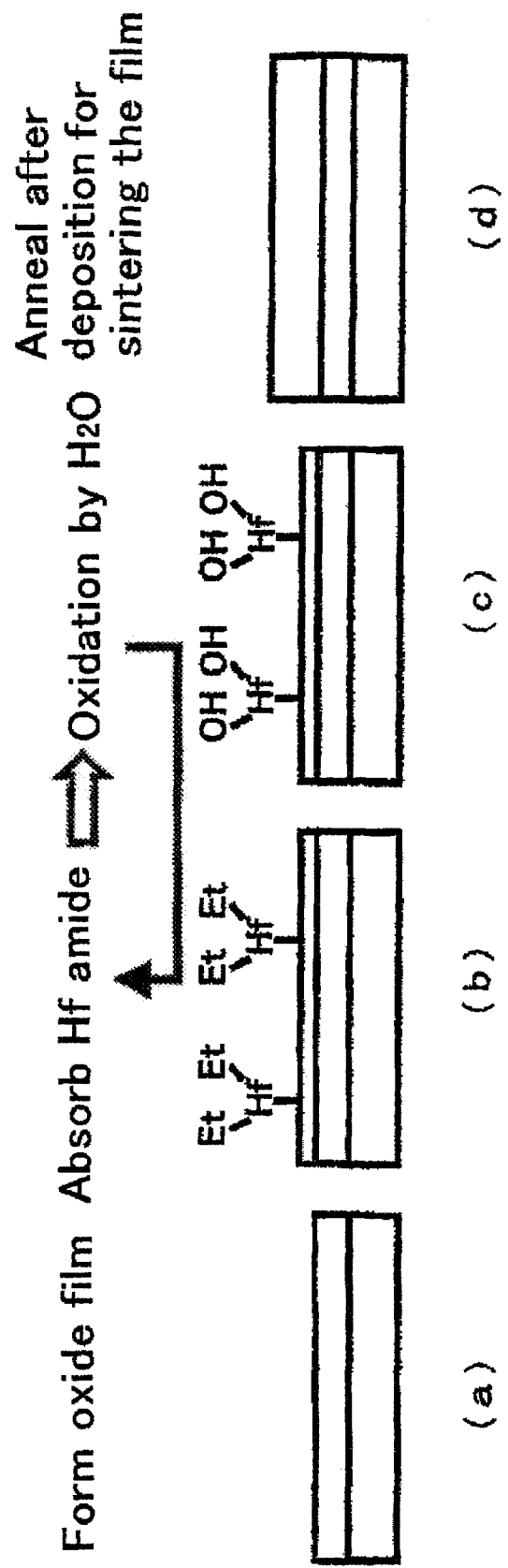
FIG. 8(*a*) to 8(*d*) are schematic sectional views showing respective steps of a conventional process for manufacturing a hafnium-silicon oxide film by using an atomic-layer-deposition technique.
Figure 9:
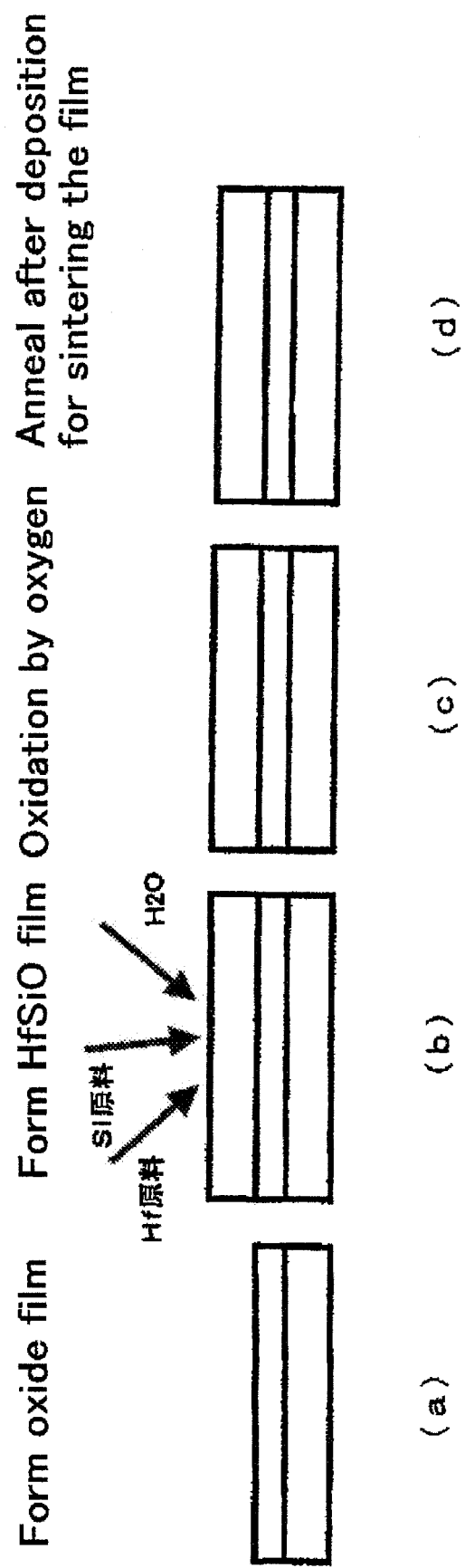
FIGS. 9(*a*) to 9(*d*) are schematic sectional views showing respective steps of a process for manufacturing a HfSiO film according to an embodiment of the present invention.
Figure 10:
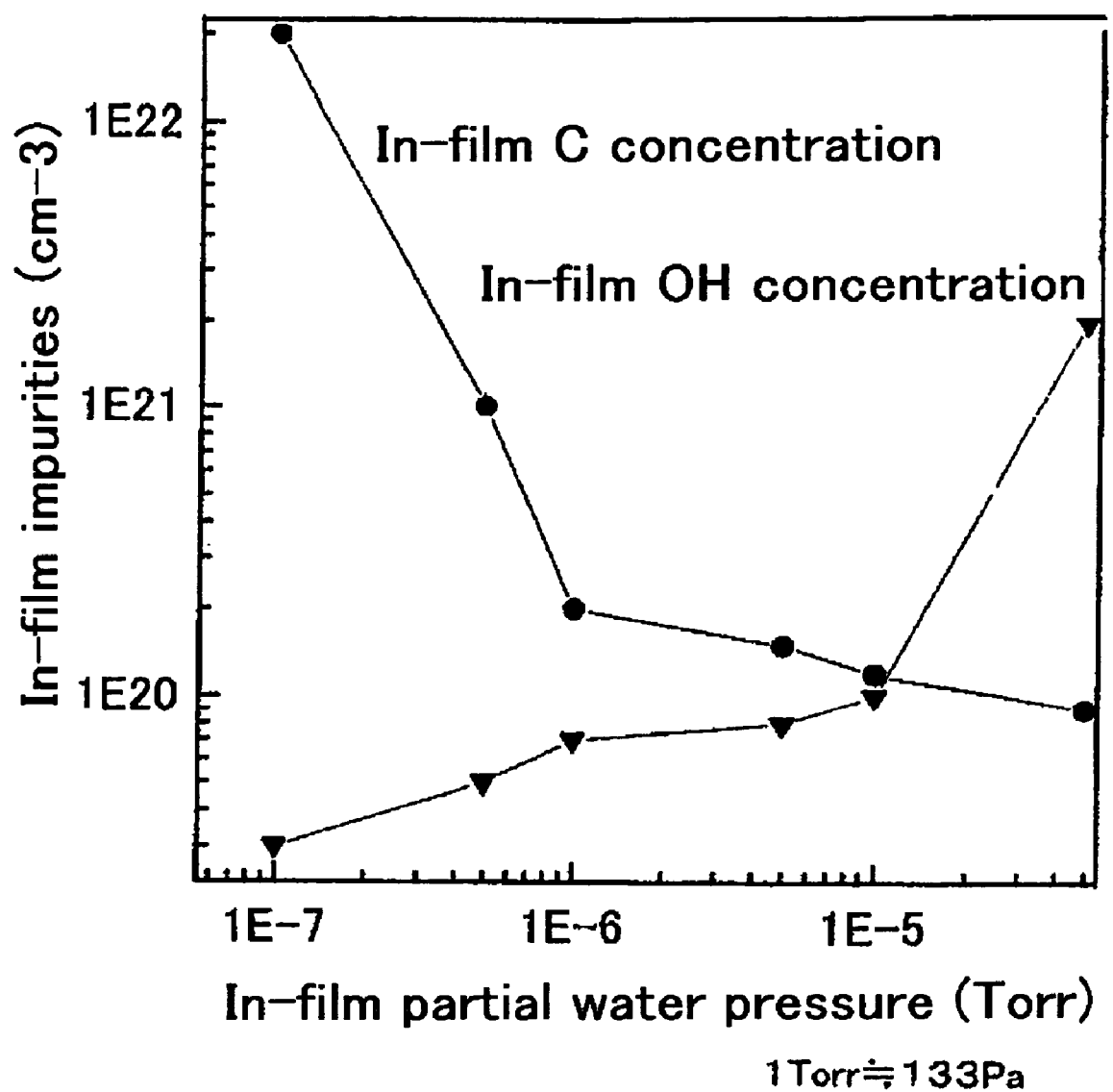
FIG. 10 is a graph sowing the relationship between the partial water pressure during forming a HfO$_2$ film by using a MOCVD technique and the amount of in-film impurities (amount of in-film carbon and amount of in-film OH groups).
Figure 11:
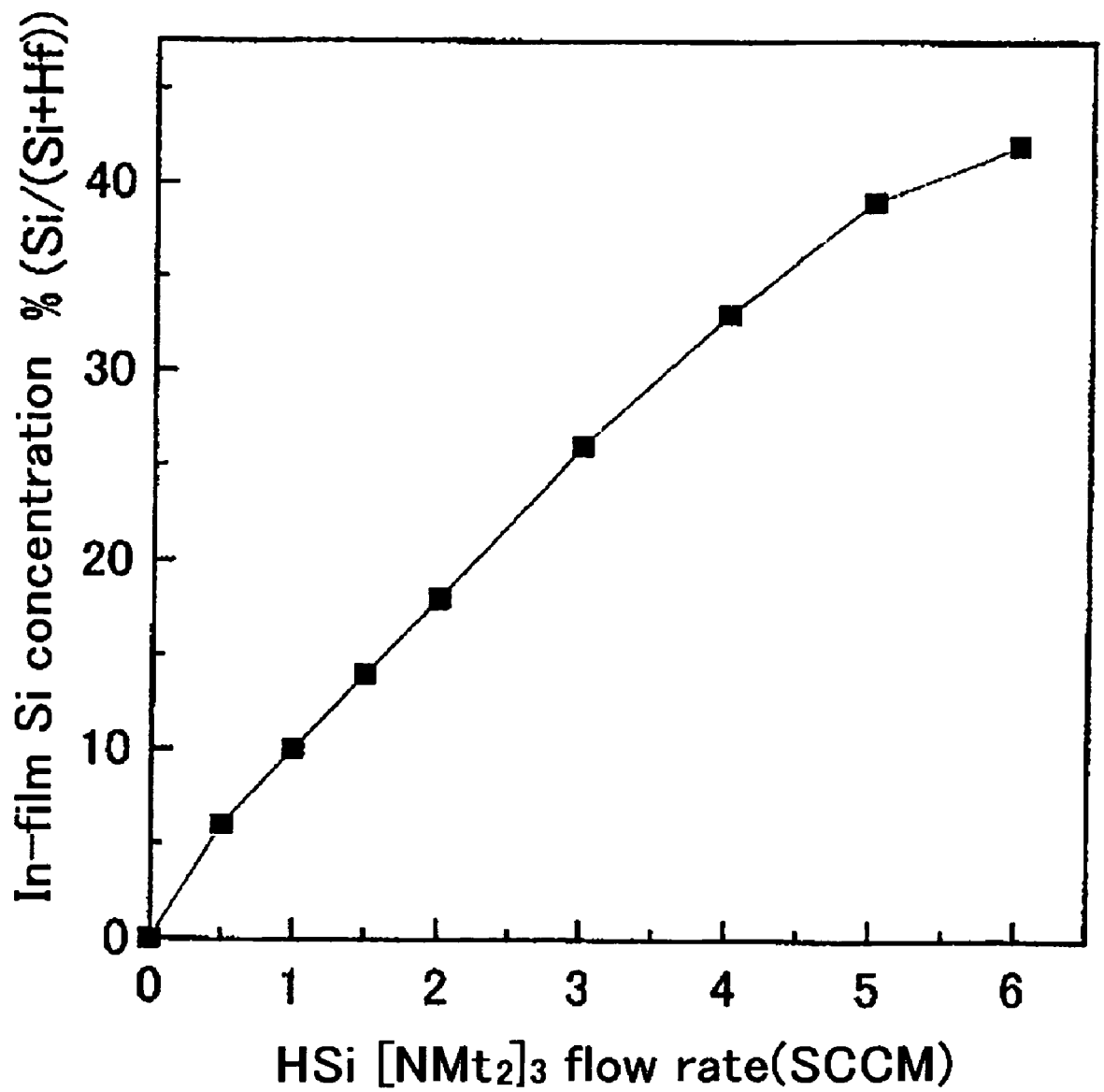
FIG. 11 is a graph showing the relationship between the flow rate of Si source and in-film Si concentration (molar ratio: Si/(Si+Hf)) in the process for forming HfSiO film by using a MOCVD technique, with the flow rate of Hf source being fixed.
Figure 12:
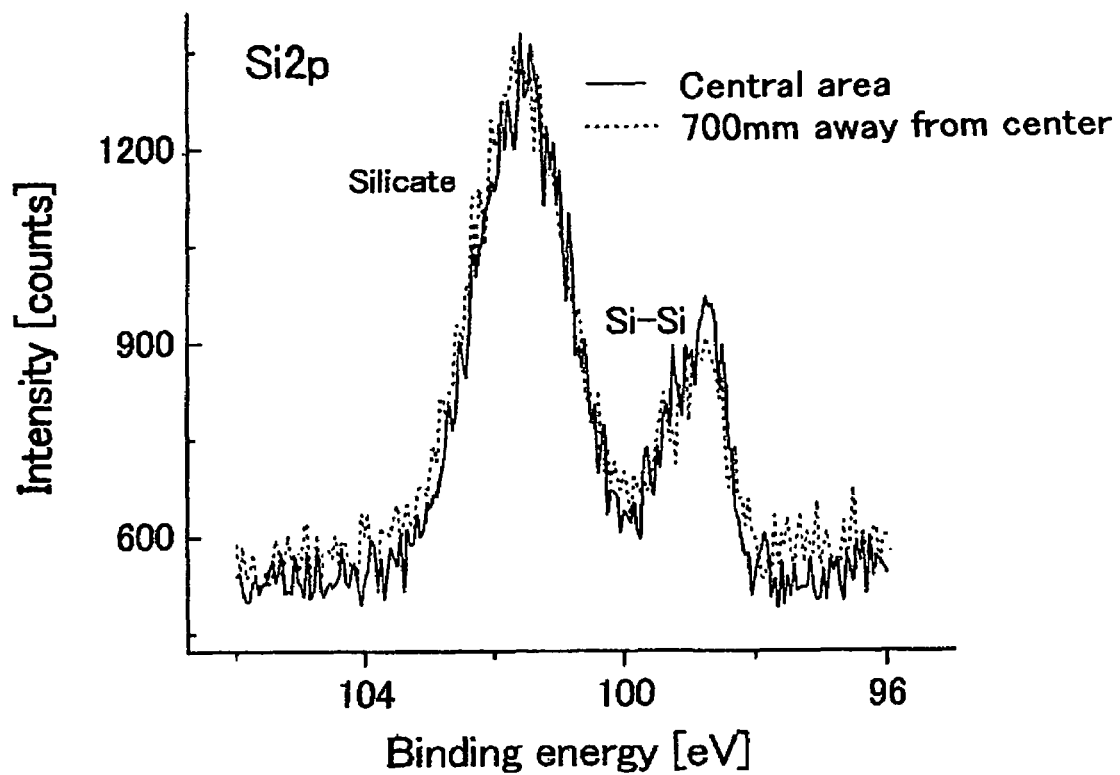
FIG. 12 is an XPS spectrum diagram of the wafer surface on which a film is formed by a method according to an embodiment of the present invention.
Figure 13:
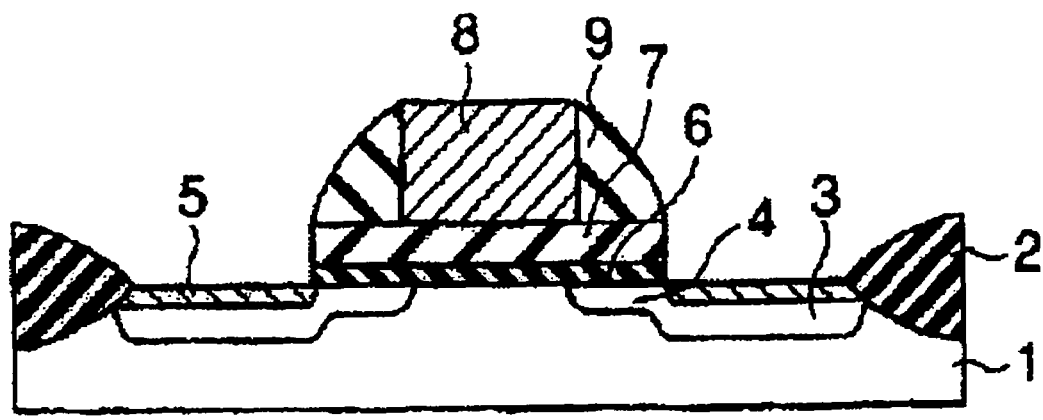
FIG. 13 is a schematic sectional view of a MISFET according to an embodiment of the present invention.
Figure 14:
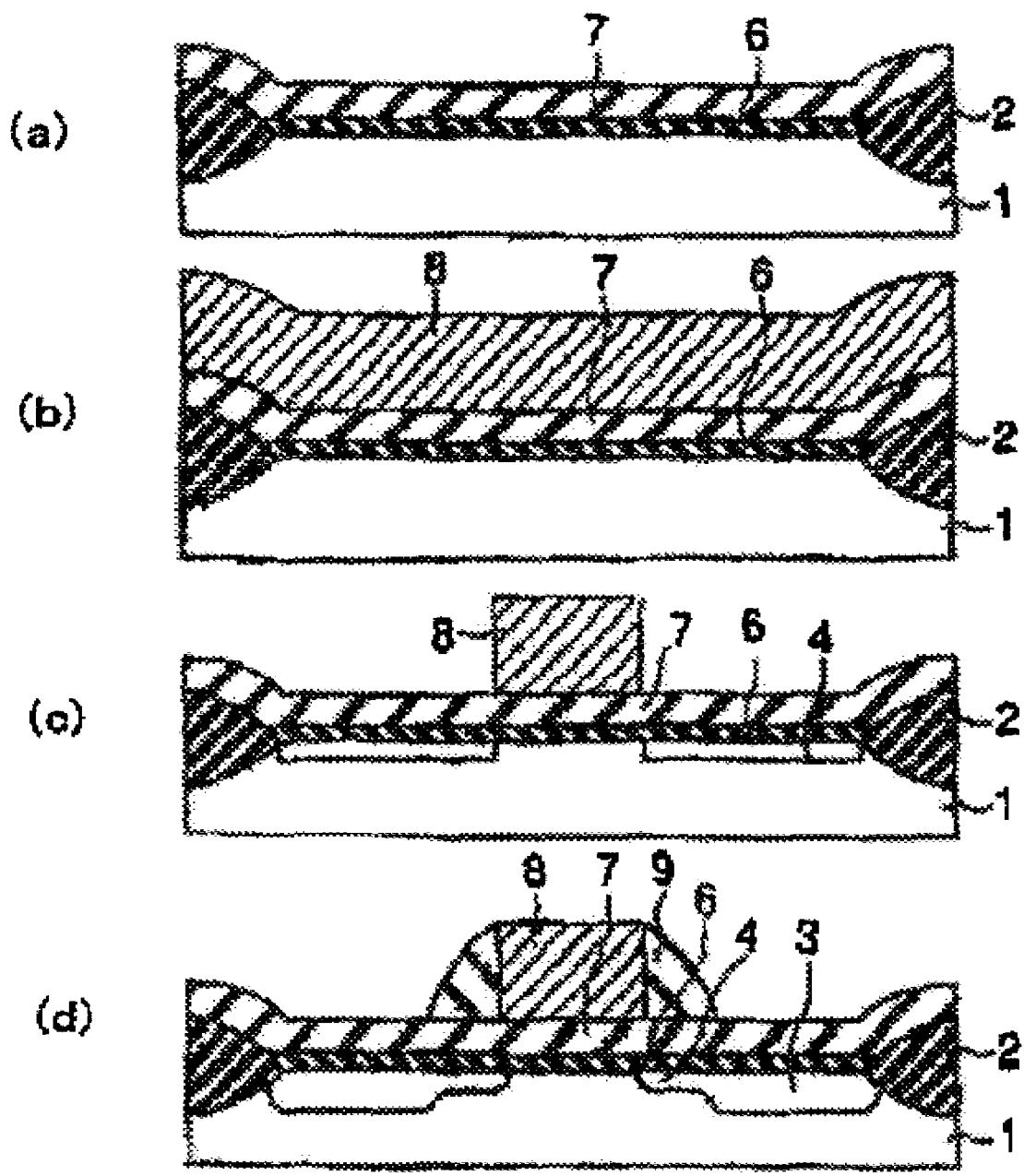
FIGS. 14(*a*) to 14(*d*) are sectional views showing the respective steps of a process for forming a MISFET according to the embodiment of the present invention.

The invention claimed is:

1. A semiconductor device comprising a MIS-type field-effect-transistor (FET), said MIS-type FET including:
    a silicon substrate;
    an insulating film formed on said silicon substrate and containing silicon and at least one of nitrogen and oxygen;
    a metal oxide film formed on said insulating film and containing silicon and hafnium; and
    a gate electrode formed on said metal oxide film, wherein:
        a silicon molar ratio (Si/(Si+Hf)) in said metal oxide film is not lower than 2% and not higher than 15% and
        said metal oxide film has a dielectric constant in a range from about 20 to about 24.

2. The semiconductor device according to claim 1, wherein said metal oxide film includes therein polycrystalline particles having diameters of not smaller than 30 nm and smaller than 100 nm.

3. The semiconductor device according to claim 1, wherein said MIS-type FET has a silicon nitride film on said metal oxide film.

4. The semiconductor device according to claim 1, wherein said dielectric constant of said metal oxide film is about 24.

5. The semiconductor device according to claim 1, wherein crystal grains of said metal oxide film are substantially free of the silicon.

6. The semiconductor device according to claim 5, wherein the silicon is located substantially at grain boundaries of the crystal grains.

7. The semiconductor device according to claim 5, wherein said crystal grains are $HfO_2$ crystals.

8. The semiconductor device according to claim 5, wherein said crystal grains have diameters in a range from about 30 nm to about 100 nm.

* * * * *